United States Patent [19]

Kobayashi et al.

[11] Patent Number: 4,760,376
[45] Date of Patent: Jul. 26, 1988

[54] ELECTRONIC CONVERSION CIRCUIT

[75] Inventors: Osamu Kobayashi, Yokohama; Kunihiko Gotoh, Kunitachi, both of Japan

[73] Assignee: Fujitsu Limited, Kawasaki, Japan

[21] Appl. No.: 902,870

[22] Filed: Sep. 2, 1986

[30] Foreign Application Priority Data

Sep. 2, 1985 [JP] Japan .................. 60-192038

[51] Int. Cl.⁴ ............................. H03M 1/02
[52] U.S. Cl. .................. 340/347 C; 340/347 AD; 340/347 DA
[58] Field of Search ............. 340/347 AD, 347 DA, 340/347 C, 347 NT, 347 CC

[56] References Cited

U.S. PATENT DOCUMENTS 3,251,052 5/1966 Hoffman .................. 340/347 AD
3,581,304 5/1971 Paradise .................. 340/347 AD
4,529,965 7/1985 Lee ........................ 340/347 AD

OTHER PUBLICATIONS

McCharles, "IEEE Trans. Circuits and Systems", vol. CAS-25, No. 7, Jul. 1978, pp. 490-497.

Primary Examiner—Charles D. Miller
Attorney, Agent, or Firm—Staas & Halsey

[57] ABSTRACT

In an electronic conversion circuit for converting an analog value to digital codes or digital codes to an analog value, the circuit comprises at least two conversion hold blocks. Each of the analog processing units has two functions, that is, one function is to perform sampling of the analog value and to circularly convert the analog value to an output analog value in order to obtain a digital value based on the output analog value, and the other function is to sequentially input digital codes and to convert digital codes in order to obtain the analog value.

9 Claims, 18 Drawing Sheets

Fig. 6

```
                              ←─ SHIFT DIRECTION
    GENERATED DIGIT    1    0   -1    0
    DP(=CP)    SR1 ─┤ 1 │ 0 │ 0 │ 0 ├─ Din

DN(=CN)    SR2 ─┤ 1 │ 1 │ 0 │ 1 ├─ Din
    +)                                1
    ─────────────────────────────────────
               1    0    1    1    0

INV ↓

0    0    1    1    0   = 3/8

(-1)  1/2  1/4  1/8  1/16
        (MSB)      └──┬──┘   (LSB)
                    3/8
```

Fig. 8 PRIOR ART

| INPUT | | | | OUTPUT | | | | | |
|---|---|---|---|---|---|---|---|---|---|
| | | | | CO="L" / C2="L" | | | CO="H" / C2="H" | | |
| A1/A3 | B1/B3 | A2/A4 | B2/B4 | Σ1/Σ3 | Σ2/Σ4 | C2/C4 | Σ1/Σ3 | Σ2/Σ4 | C2/C4 |
| L | L | L | L | L | L | L | H | L | L |
| H | L | L | L | H | L | L | L | H | L |
| L | H | L | L | H | L | L | L | H | L |
| H | H | L | L | L | H | L | H | H | L |
| L | L | H | L | L | H | L | H | H | L |
| H | L | H | L | H | H | L | L | L | H |
| L | H | H | L | H | H | L | L | L | H |
| H | H | H | L | L | L | H | H | L | H |
| L | L | L | H | L | H | L | H | H | L |
| H | L | L | H | H | H | L | L | L | H |
| L | H | L | H | H | H | L | L | L | H |
| H | H | L | H | L | L | H | H | L | H |
| L | L | H | H | L | L | H | H | L | H |
| H | L | H | H | H | L | H | L | H | H |
| L | H | H | H | H | L | H | L | H | H |
| H | H | H | H | L | H | H | H | H | H |

Fig. 15A

◆ A/D MODE

| INPUT VOLTAGE Vi | OUTPUT CODE (DB$_{15\sim 0}$) |
|---|---|
| $\geq +V_R$ | 0111 1111 1111 1111 |
| $+V_R -1LSB$ | 0111 1111 1111 1111 |
| $+V_R/2$ | 0100 0000 0000 0000 |
| 0 | 0000 0000 0000 0000 |
| $-1LSB$ | 1111 1111 1111 1111 |
| $-V_R/2$ | 1100 0000 0000 0000 |
| $-V_R +1LSB$ | 1000 0000 0000 0001 |
| $\leq -V_R$ | 1000 0000 0000 0001 |

Fig. 15B

◆ D/A MODE

| INPUT CODE (DB$_{15\sim0}$) | OUTPUT VOLTAGE V$_O$ |
|---|---|
| 0111 1111 1111 1111 | $\geq$ + V$_R$ −1LSB |
| 0111 1111 1111 1111 | + V$_R$ −1LSB |
| 0100 0000 0000 0000 | + V$_R$/2 |
| 0000 0000 0000 0000 | 0 |
| 1111 1111 1111 1111 | −1LSB |
| 1100 0000 0000 0000 | − V$_R$/2 |
| 1000 0000 0000 0001 | − V +1LSB |
| 1000 0000 0000 0001 | $\leq$ − V$_R$ |

ELECTRONIC CONVERSION CIRCUIT

BACKGROUND OF THE INVENTION

1. Field of the Invention

The present invention relates to an electronic conversion circuit for converting an analog value to digital codes or digital codes to an analog value. This circuit is advantageously used in the field of measurements.

2. Description of the Related Art

Conversion of an analog value to digital codes or digital codes to an analog value is usually performed in the field of measurements. In general, it is necessary that the conversion circuit have such characteristics as a high conversion speed, high resolution, small power consumption, and small quantizing errors. There is known, for example, an analog-to-digital (A/D) conversion circuit which employs a cyclic A/D conversion method. In this conventional circuit, it is necessary to provide at least one voltage conversion block, a sample hold block, and a comparison block. Accordingly, two steps of "conversion" and "sample hold" are necessary to obtain a single digital bit since the conversion is completed through these blocks as one cycle. There are, however, problems in the conversion speed and so called "clock feed through error" caused by an increased number of analog switches.

SUMMARY OF THE INVENTION

The object of the present invention is to provide an electronic conversion circuit for converting an analog value to digital codes or digital codes to an analog value at a high speed of conversion with high resolution, small power consumption, and small quantizing errors.

In accordance with the present invention, there is provided an electronic conversion circuit for converting an analog value to digital codes or digital codes to an analog value comprising at least two analog processing units. One function of the analog processing unit to perform sampling of an analog value and to convert the analog value to an output analog value in order to obtain a digital value based on the output analog value. Another function of the analog processing unit is to perform sampling of an analog value to receive digital codes and to convert the analog value to digital codes in order to obtain an analog value.

BRIEF DESCRIPTION OF THE DRAWINGS

In the drawings:

FIG. 6 an explanatory diagram for explaining the operation of the shift registers and adders shown in FIG. 4, FIG. 8 is a function chart of the circuit shown in FIG. 7.

DESCRIPTION OF THE PREFERRED EMBODIMENTS

Before describing the preferred embodiments, an explanation will be given of a conventional electronic conversion circuit.

Figure 1:
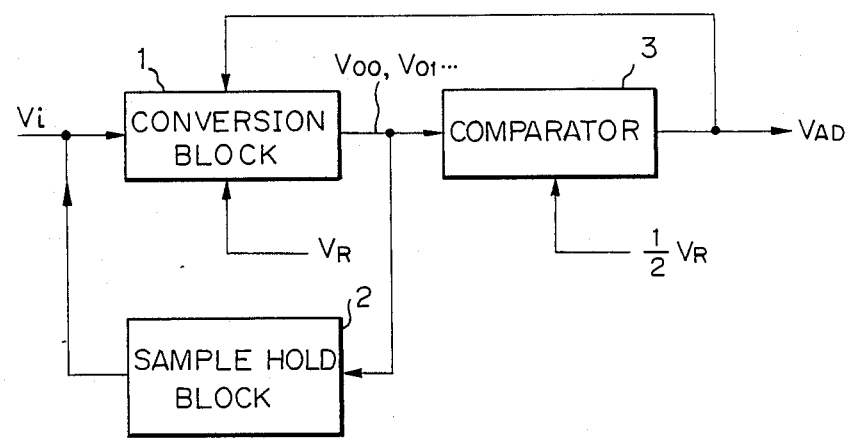
FIG. 1 is a block diagram of a conventional electronic conversion circuit.

Referring to FIG. 1, this type of analog-to-digital conversion circuit is called a cyclic A/D conversion method. In FIG. 1, reference number 1 represents a conversion block, 2 a sample hold block, and 3 a comparator. Reference letter V represents an analog input voltage, $V_{00}$, $V_{01}$ represent output voltages of the conversion block 1, $V_R$ represents a reference voltage, $V_r/2$ represents a decision level voltage, and $V_{Ad}$ represents a digital output.

The operations of this circuit will be explained briefly hereinafter.

When the analog input voltage is applied to the conversion block 1, the output voltage $V_{00}$, which is converted from the analog input voltage, is applied to the sample hold block 2 and the comparator 3. In the sample hold block 2, an electric charge is held at the output voltage $V_{00}$. In the comparator, the voltage $V_{00}$ is compared with one-half of the reference voltage $V_R$, which is used as a decision level voltage $V_R/2$. When the voltage $V_{00}$ is larger than the decision level voltage $V_R/2$, a digit "1" is generated as a digital output $V_{AD}$. When the voltage $V_{00}$ is smaller than the $V_R/2$, the digit "0" is generated. These digits are also fed back to the conversion block 1 and used as a command signal for controlling whether subtraction of the reference voltage $V_R$ occurs.

The voltage $V_{00}$ held in the sample hold block 2 is added to the conversion block 1 as the input voltage. In the conversion block 1, the voltage $V_{00}$ is added to the voltage $V_{00}$ which is held as the output voltage generated based on the previous input voltage, and the resultant data is then output as the output voltage $V_{01}$ after subtraction of the reference voltage $V_R$ without subtraction in accordance with the command from the comparator.

Details of the above explanations will be given by using concrete data. In this case, the input voltage; $V_i = 0.875$ (V)
the reference voltage; $V_R = 1$ (V)
the decision level voltage; $V_R/2 = 0.5$ (V) are previously given.

Step 1. In the conversion block 1;

When the analog voltage 0.875 (V) is input as the input voltage $V_i$, the voltage 0.875 (V) occurs as the output voltage $V_{00}$ in the first stage.

Step 2. In the comparator 3;

When the voltage $V_{00}$ (=0.875 V) is compared with the decision level voltage $V_R/2$ (=0.5 V), the voltage $V_{00}$ is naturally larger than the voltage $V_R/2$, and thus the digit "1" is output as the digital output $V_{AD}$. Simultaneously, this digital output $V_{AD}$ is fed back to the conversion block 1 so as to subtract the reference voltage $V_R$ from the resultant data.

Step 3. In the sample hold block 2;

An internal capacitor (not shown) is charged by the voltage $V_{00}$ (=0.875 V) and this voltage $V_{00}$ (=0.875 V) is applied to the conversion block 1 as the input voltage generated in the inner circuit.

Step 4. In the conversion block 1;

The voltage $V_{00}$ (=0.875 V) from the sample hold block 2 is added to the previously held output voltage $V_{00}$ (=0.875 V) and the reference voltage $V_R$ is subtracted from the above resultant data. Accordingly, $$V_{01} = 2V_{00} - V_R$$
$$= 2 \times 0.875 - 1 = 0.75(V)$$

Step 5. In the comparator 3;

When the output voltage $V_{01}$ (=0.75 V) is compared with the decision level voltage (=0.5 V), the voltage $V_{01}$ is naturally larger than the voltage $V_R/2$, and thus the digit "1" is output as the digital output $V_{AD}$. Simultaneously, this digital output $V_{AD}$ is fed back to the conversion block 1 so as to subtract the reference voltage $V_R$ from the resultant data.

Step 6. In the sample hold block 2;

The internal capacitor is charged by the voltage $V_{01}$ (=0.75 V), and this voltage $V_{01}$ (=0.75 V) is also applied to the conversion block 1 as the input voltage generated in the inner circuit.

Step 7. In the conversion block 1;

The voltage $V_{01}$ (=0.75 V) from the sample hold block 2 is added to the previously held output voltage $V_{01}$ (=0.75 V) and the reference voltage $V_R$ is subtracted from the above resultant data. Accordingly, $$V_{02} = 2V_{01} - V_R$$
$$= 2 \times 0.75 - 1 = 0.5(V)$$

Step 8. In the comparator 3;

When the output voltage $V_{02}$ (=0.5 V) is compared with the decision level voltage (=0.5 V), the voltage $V_{02}$ is naturally equal to the voltage $V_R/2$, and thus the digit "1" is output as the digital output $V_{AD}$. Simultaneously, this digital output $V_{AD}$ is fed back to the conversion block 1 so as to subtract the reference voltage $V_R$ from the resultant data.

Step 9. In the sample hold block 2;

The internal capacitor is charged by the voltage $V_{02}$ (=0.5 V), and this voltage $V_{02}$ (=0.5 V) is also applied to the conversion block 1 as the input voltage generated in the inner circuit.

Step 10. In the conversion block 1;

The voltage $V_{02}$ (=0.5 V) from the sample hold block 2 is added to the previously held output voltage $V_{02}$ (=0.5 V) and the reference voltage $V_R$ is subtracted from the above resultant data. Accordingly, $$V_{03} = 2V_{02} - V_R$$
$$= 2 \times 0.5 - 1 = 0(V)$$

Since the output voltage became 0 (V), the voltage conversion is completed and a digital value "111" is obtained from the comparator 3 as the digital output.

As can be understood from the above explanation, in the conventional analog-to-digital conversion circuit, it is necessary to provide two blocks, i.e., a voltage conversion block for obtaining a digital value based on the reference voltage and a sample hold block for holding the converted output voltage. Therefore, two steps are necessary to obtain one digital bit since the signal passes through the conversion block and the sample hold block in each cycle. These two steps become obstacles to high speed analog-to-digital conversion. Moreover, because it is necessary to provide many analog switches, these many analog switches cause a so-called "clock feed through error" when, for example, a MOS FET is used as the analog switching means.

An electronic conversion circuit according to the present invention will be explained in detail hereinafter.

Figure 2:
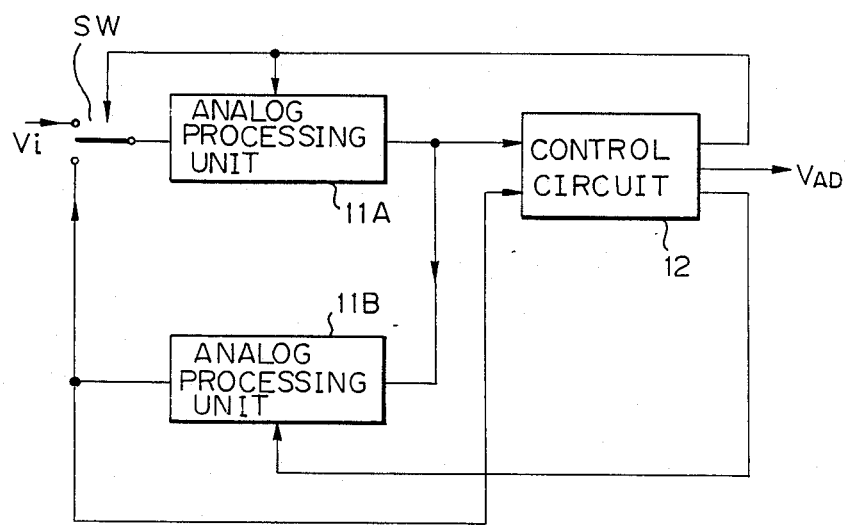
FIG. 2 is a block diagram of an electronic conversion circuit according to the present invention.

Referring to FIG. 2, reference numbers 11A and 11B represent analog processing units. These units have the same structure and the detailed structure thereof will be explained with reference to FIGS. 3A to 3H. Reference number 12 represents a control circuit and SW an input changing switch. The control circuit 12 includes at least one comparator for comparing an output voltage from the analog processing unit 11A with the decision level voltage, a series-to-parallel conversion shift register and an adder, a gate circuit for controlling the connection of switches provided in the analog processing unit, and a flip-flop circuit for latching the output from the comparator.

According to the present invention, a sampling operation and conversion are repeated alternately in each analog processing unit. Therefore, two digital bits can be obtained when the signal passes through these two units in a single cycle. In this case, the switch SW is changed between the input side and the feedback side based on a command from the control circuit 12.

Figure 3A:
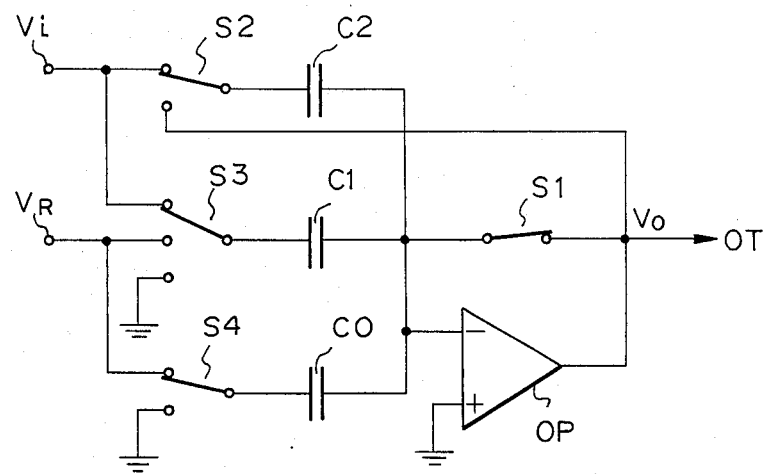
FIGS. 3A to 3H are detailed circuits of an analog processing unit shown in FIG. 2.
Figure 3B:
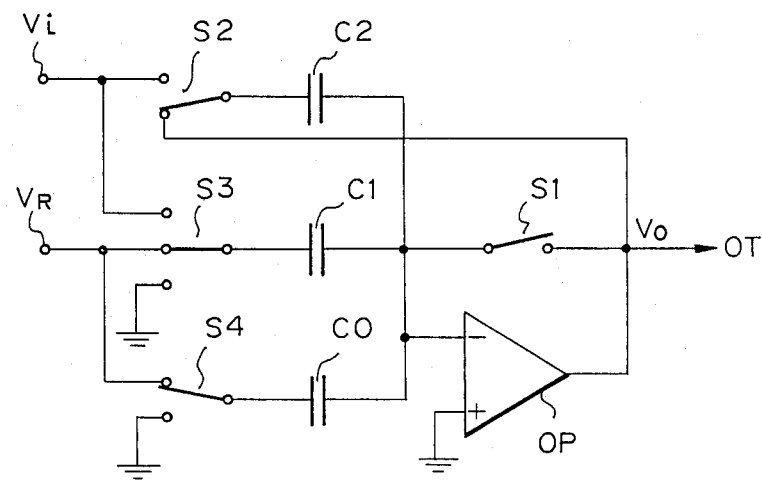
Figure 3C:
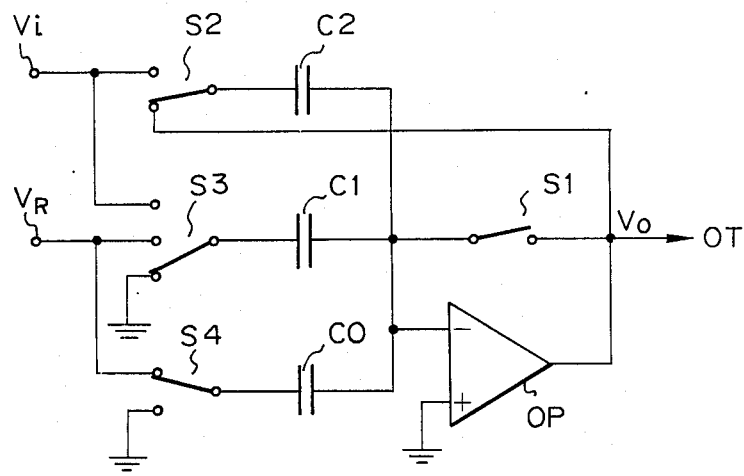
Figure 3D:
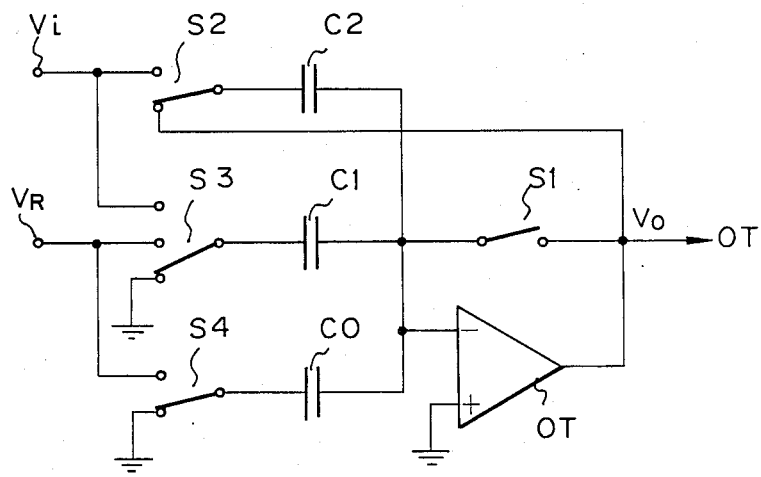
Figure 3E:
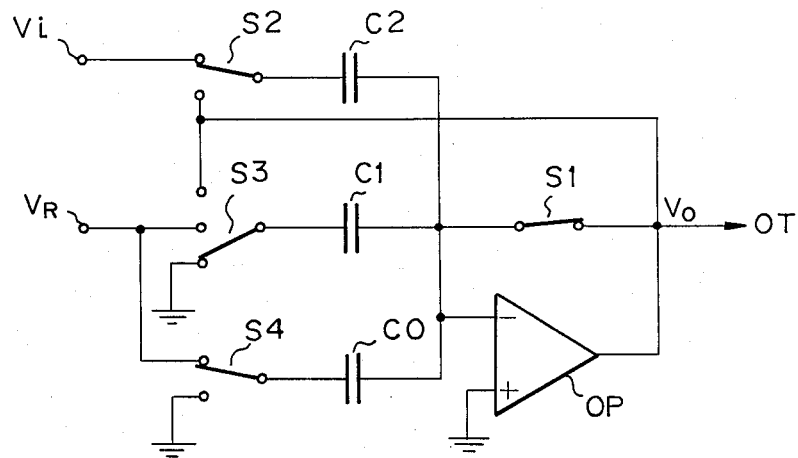
Figure 3F:
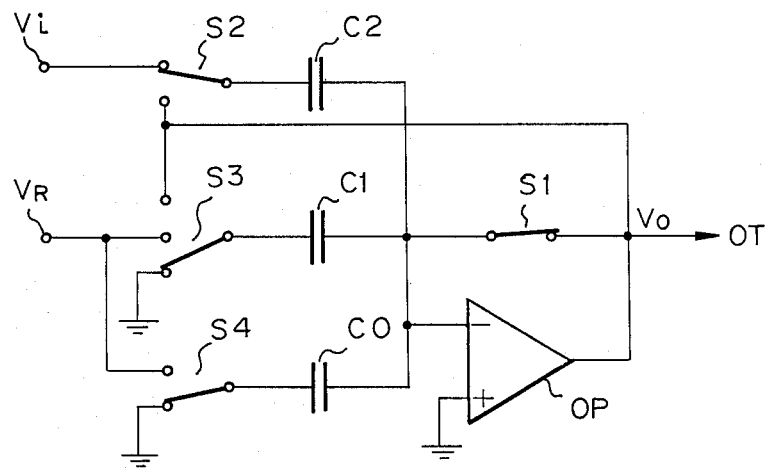

Referring to FIGS. 3A to 3H, each analog processing unit used in the electronic conversion circuit comprises an operational amplifier OP having at least a noninverting input terminal, an inverting input terminal and an output terminal; three capacitors C0 to C2; and four switches S1 to S4 corresponding to the first to fourth switching means. The differences between these figures lie in the connection configurations of the switches S1 to S4. Each of the capacitors C0 to C2 has an equal capacitance. The switch S3 and the capacitor C1 constitute a charging/discharging unit. $V_i$ represents the input voltage, $V_R$ represents the reference voltage, and $V_O$ represents the output voltage. OT represents the output terminal. When these circuits are used in an analog-to-digital conversion circuit or a digital-to-analog conversion circuit, the output is obtained from the capacitor C2. In the analog-to-digital conversion, the output terminal OT is connected to a comparator in the control circuit 12. The circuits shown in FIGS. 3A, 3E, and 3F are used for the sampling operation of the input voltage $V_i$. The other circuits are used for the conversion from the input voltage to the output voltage. By changing the connections of these switches, the following output voltages $V_O$ can be obtained in at the output terminal OT. That is, in FIGS. 3B to 3D, (1) $V_O = 2V_i - V_R$
(2) $V_O = 2V_i$
(3) $V_O = 2V_i + V_R$ In FIGS. 3G and 3H, (4) $V_O = (V_i + V_R)/2$
(5) $V_O = V_i/2$
(6) $V_O = (V_i - V_R)/2$ In order to obtain the three kinds of output voltages shown in items (1) to (3), the following controls are necessary for the analog-to-digital conversion.

A. In FIG. 3A, the sampling of the input voltage $V_i$ is performed as follows.
    switch S1: ON
    switch S2: to $V_i$
    switch S3: to $V_i$
    switch S4: to $V_R$
    capacitor C0: charged by $V_R$
    capacitor C1: charged by $V_i$
    capacitor C2: charged by $V_i$ B. In FIG. 3B, the conversion of "$-V_R$" is performed as follows.
    switch S1: OFF
    switch S2: to output terminal OT
    switch S3: to $V_R$
    switch S4: to $V_R$
    capacitor C0: charged by $V_R$
    capacitor C1: charged by $V_R$
    capacitor C2: charged by $2V_i - V_R$ In this case, the electric charge quantity of the capacitor C2 is given by $2V_i - V_R$, based on "the principle of conservation of the charge". That is, although the electric charge quantity of the capacitor C0 is not changed, that of the capacitor C1 is changed to $V_R$. Accordingly, the charge quantity $V_i - V_R$ in the capacitor C1 is migrated to the capacitor C2, based on the above "principle". Therefore, the electric charge quantity of the capacitor C2 is given by, $$V_i + V_i - V_R = 2V_i - V_R$$

In this case, although each electric charge quantity is given by multiplying the capacitance by the voltage, i.e., $C \times V$, these capacitances are omitted in the descriptions since the capacitances of each of the capacitors C0, C1 and C2 are equal.

C. In FIG. 3C, the conversion of "0" is performed as follows.
    switch S1: OFF
    switch S2: to output terminal OT
    switch S3: to ground
    switch S4: to $V_R$
    capacitor C0: charged by $V_R$
    capacitor C1: to ground
    capacitor C2: charged by $2V_i$ In this case, the electric charge quantity of the capacitor C2 is given by $2V_i$, based on the above "principle". That is, although the electric charge quantity of the capacitor C0 is held, that of the capacitor C1 is migrated to the capacitor C2, based on the above "principle". Therefore, the electric charge quantity C2 is given by, $$V_i + V_i = 2V_i$$

D. In FIG. 3D, the conversion of "$+V_R$" is performed as follows.
    switch S1: OFF
    switch S2: to output terminal OT
    switch S3: to ground
    switch S4: to ground
    capacitor C0: to ground
    capacitor C1: to ground
    capacitor C2: charged by $2V_i + V_R$ In this case, as explained above, the electric charge quantities of the capacitors C0 and C1 are migrated to the capacitor C2, based on the above "principle". Accordingly, the electric charge quantity of the capacitor C2 is given by, $$V_i + V_i + V_R = 2V_i + V_R$$

As explained in items B to D, three kinds of output voltages $V_O$ can be obtained by changing the connections of the switches S3 and S4. The feature of the present invention lies in the control of the switches S3 and S4.

In order to obtain another three kinds of output voltages as shown in items (4) to (6), the following controls are necessary for the digital-to-analog conversion. In these conversions, it is necessary to perform the sampling in correspondence with each conversion of "$+V_R$", "0", and "$-V_R$".

E. In FIG. 3E, the sampling of the input voltage $V_i$ is performed with respect to the conversion "$+V_R$" as follows.
    switch S1: ON
    switch S2: to $V_i$
    switch S3: to ground
    switch S4: to $V_R$
    capacitor C0: charged by $V_R$
    capacitor C1: to ground
    capacitor C2: charged by $V_i$ In FIG. 3F, the sampling of the input voltage $V_i$ is performed with respect to the conversion "0" as follows.
    switch S1: ON
    switch S2: to $V_i$
    switch S3: to ground
    switch S4: to ground
    capacitor C0: to ground
    capacitor C1: to ground
    capacitor C2: charged by $V_i$ With respect to the conversion "$-V_R$", the sampling of the input voltage $V_i$ is performed based on the same connections as shown in FIG. 3F.

Figure 3G:
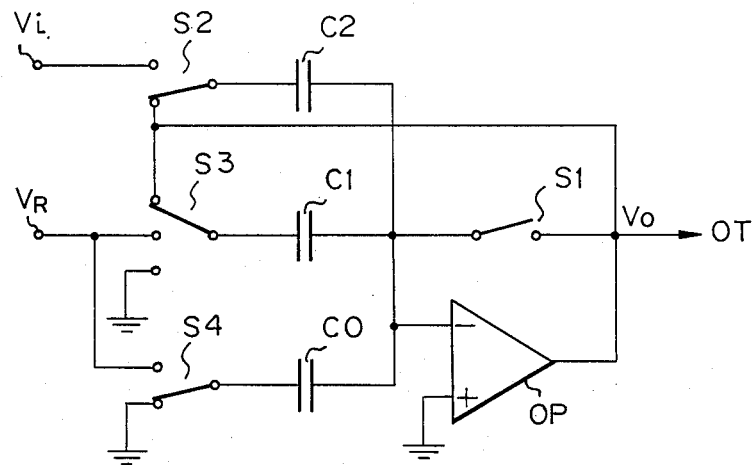

G. In FIG. 3G, the conversion of "$+V_R$" is performed as follows.
    switch S1: OFF
    switch S2: to output terminal OT
    switch S3: to output terminal OT
    switch S4: to ground
    capacitor C0: to ground
    capacitor C1: to output terminal OT
    capacitor C2: charged by $(V_i + V_R)/2$ With respect to the conversion of "0", the procedure is based on the same connections as shown in FIG. 3G. In this case, the capacitor C2 is charged by $V_i/2$.

Figure 3H:
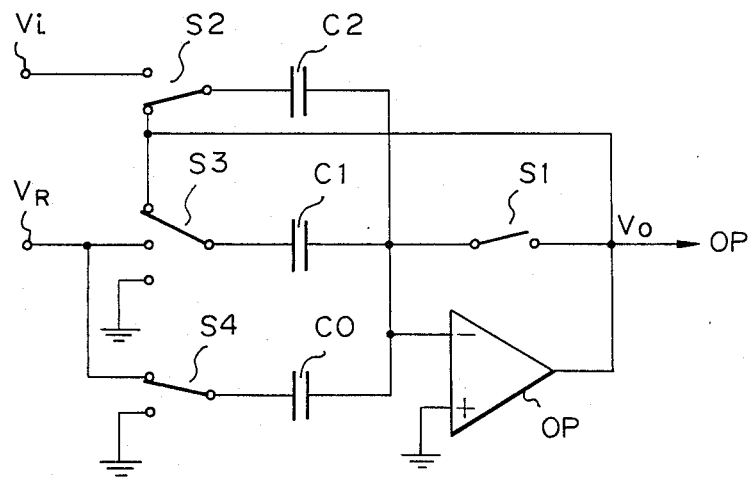

H. In FIG. 3H, the conversion of "$-V_R$" is performed as follows.
    switch S1: OFF
    switch S2: to output terminal OT switch S3: to output terminal OT
switch S4: to $V_R$
capacitor C0: charged by $V_R$
capacitor C1: to output terminal OT
capacitor C2: charged by $(V_i-V_R)/2$ As can be understood from the above explanations, these conversions are also based on "the principle of conservation of the charge".

As explained in items E to H, another three kinds of output voltages can be obtained by changing the connections of the switches S3 and S4.

Figure 4:
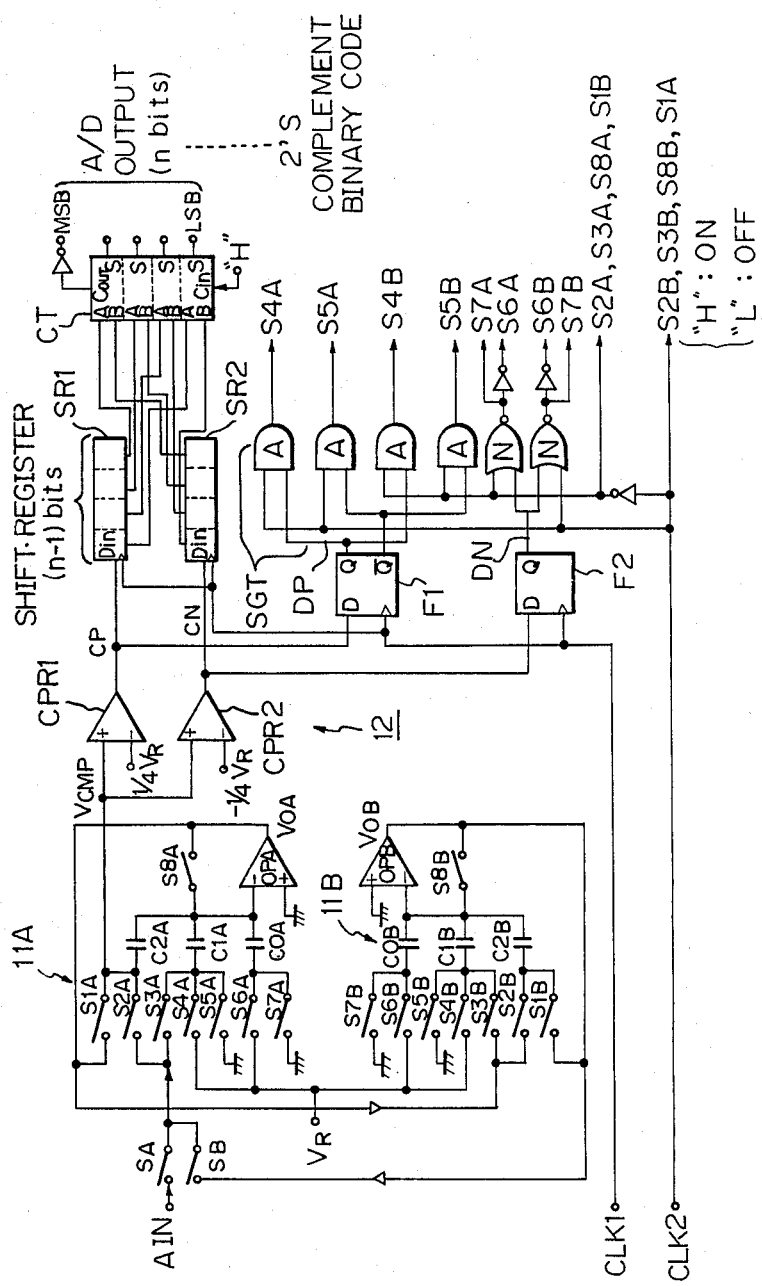
FIG. 4 is a detailed block diagram of an analog-to-digital conversion circuit shown in FIG. 2.

Referring to FIG. 4, two of the circuits shown in FIGS. 3A to 3D are used as the analog processing unit of the analog-to-digital conversion circuit. That is, reference number 11A is the same as circuit 11B, A1N is an analog input signal, and CLK1 and CLK2 are clock signals. These signals are input from an external circuit (not shown). Switches SA and SB are/ input changing switches, S1A to S7A and S1B to S7B are also circuit changing switches, and S8A and S8B are mode changing switches C0A to C2A and C0B to C2B are capacitors for conversion, and OPA and OPB are operational amplifiers. These elements correspond to those of FIGS. 3A to 3H. That is, switches S8A and S8B correspond to the switch S1; S1A, S2A and S1B, S2B correspond to the switch S2; S3A to S5A and S3B to S5B correspond to the switch S3; and S6A, S7A and S7B correspond to the switch S4.

Reference letters CPR1 and CPR2 are comparators, SR1 and SR2 are shift registers for series-to-parallel conversion and plus/minus code conversion, and CT is an adder. F1 and F2 are latch circuits for latching the output from the comparators, and SGT is a gate circuit constituted by AND gates A and NOR gates N. The switches shown in the circuit 11A and 11B are controlled by the outputs of these AND gates and NOR gates. When the output is high level, the corresponding switch is turned ON, and when the output is low level, the corresponding switch is turned OFF.

The operation of these circuits will be explained in detail with reference to FIG. 5.

Figure 5:
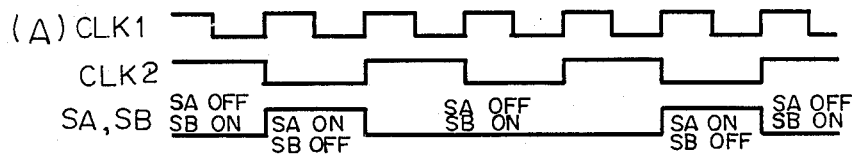
FIG. 5 is a chart for explaining the operation of circuit shown in FIG. 4

In FIG. 5, a section (A) represents waveforms of the clock signals CLK1 and CLK2 and of the ON/OFF timing of the switches SA and SB. Section (B) represents the ON/OFF of each switch, and various signals. Reference numbers 1 to 4 in section (B) represent steps of operation of the circuit shown in FIG. 4. The asterisks in the chart represent a value determined by an input voltage A1N.

In step 1;

The connection configurations of the switches S1A to S8A are the same as that of FIG. 3A. That is, in this step, an input analog voltage A1N is taken into the circuit 11A through the switch SA. Accordingly, the sampling operation of the input analog voltage can be performed by this step. In this state, the capacitor C0A is charged by the reference voltage $V_R$, and the capacitors C1A and C2A are charged by the input voltage A1N (the same as $V_i$ mentioned before). Since the switch S2A is turned ON, the input voltage A1N is input to the comparators CPR1 and CPR2 as the voltage $V_{CMP}$. The voltage $V_{CMP}$ is compared with the decision level voltages $+V_R/4$ (in the comparator CPR1) and $-V_R/4$ (in the comparator CPR2).

Assuming that the input voltage A1N is $\frac{3}{8}$ (V), this voltage is larger than both decision level voltages $+\frac{1}{4}$ (V) and $-\frac{1}{4}$ (V) (in this case, the reference voltage $V_R$ is 1 (V)). Accordingly, the comparator outputs CP and CN are high (H) level. The asterisks attached to both "H" levels of the CP and CN denote that these levels are decided when the input voltage is $\frac{3}{8}$ (V).

In step 2;

The circuit 11A corresponds to FIG. 3B and the circuit 11B corresponds to FIG. 3A in this step. When the switches S1A to S8A and S1B to S8B are connected as shown in the chart, the comparator output voltages CP and CN are output to the shift registers SR1, SR2 and the flip flop circuits F1, F2. In this case, the output CP is input to the shift register SR1 and the flip flop F1 and the output CN is input to the shift register SR2 and the flip flop F2. The clock signal CLK2 is "H" level, and accordingly, the switches S2B, S3B, S8B and S1A are turned ON. Moreover, the clock signal CLK2 is input to each of the AND gates A and NOR gates N, and each of the switches is then turned ON/OFF in correspondence with the "H" or "L" level of the gate output SGT.

Accordingly, in the circuit 11A, the output voltage $V_{OA}$ of the operational amplifier OPA is obtained based on the formula $V_0=2V_i-V_R$, as follows.

$$V_{OA}=2\times\tfrac{3}{8}-1=-\tfrac{1}{4} \text{ (V)}$$

where, A1N $(V_i)=\tfrac{3}{8}$ (V)

In the circuit 11B, the capacitor C0B is charged up by the reference voltage $V_R$, and the capacitors C1B and C2B are charged up by the output voltage $V_{OA}$ ($-\tfrac{1}{4}$ V) of the operational amplifier OPA. The output voltage $V_{OA}$ is input to both the comparators CPR1 and CPR2 as the input voltage $V_{CMP}$, through the switch S1A.

The voltage $V_{CMP}$ is compared with the decision level voltages $+V_R/4$ and $-V_R/4$. Since the reference voltage $V_R$ is 1 V, the decision level voltages become $+\tfrac{1}{4}$ and $-\tfrac{1}{4}$ (V). Therefore, as a result, $$+\tfrac{1}{4}>V_{CMP}=-\tfrac{1}{4}\geq-\tfrac{1}{4}$$

Accordingly, the output voltage CP is "L" level and the output voltage CN is "H" level. In this case, since the input voltage $V_i=\tfrac{3}{8}$ (V), the generated digit is given by "1".

In step 3;

The circuit 11A corresponds to FIG. 3A and the circuit 11B correspond to FIG. 3C. When the switches S1A to S8A and S1B to S8B are connected as shown in the chart, the output voltages CP and CN, which are obtained in Step 2, are taken into the shift registers SR1, SR2 and the flip flops F1, F2, and processed as new voltages DP and DN.

In the circuit 11B, the output voltage $V_{OB}$ of the operational amplifier OPB is given as follows, based on the formula $V_0=2V_i$.

$$V_{OB}=2\times(-\tfrac{1}{4})=-\tfrac{1}{2} \text{ (V)}$$

where, $V_i(-\tfrac{1}{4})$ is given by the previous output voltage $V_{OA}$ in Step 2. The voltage $V_{OB}$ ($=V_{CMP}$) is compared with the decision level voltages $+\tfrac{1}{4}$ and $-\tfrac{1}{4}$. As is obvious, both output voltages CP and CN become "L" level. Since the previous input voltage $V_i$ is $-\tfrac{1}{4}$ (V), the generated digit is given by "0".

In step 4;

The circuit 11A corresponds to FIG. 3D and the circuit 11B corresponds to FIG. 3A. When the switches S1A to S8A and S1B and S8B are connected as shown in the chart, the output voltages CP and CN, which are obtained in Step 3, are taken in to the shift registers SR1, SR2 and the flip flops F1, F2, and processed as new voltages DP and DN.

In the circuit 11A, the output voltage $V_{OA}$ of the operational amplifier OPA is given as follows, based on the formula $V_0 = 2V_i + V_R$.

$$V_{OA} = 2 \times (-\tfrac{1}{2}) + 1 = 0 (V)$$

where, $V_i (-\tfrac{1}{2})$ is given by the previous output voltage $V_{OB}$ in Step 3. The voltage $V_{OA} (= V_{CMP})$ is compared with the decision level voltages. In this case, as a result, $$\tfrac{1}{2} > 0 > -\tfrac{1}{2}$$

Thus, the output voltage CP is "L" level and the output voltage CN is "H" level. Since the previous input voltage $V_i$ is $-\tfrac{1}{2}$ (V), the generated digit is given by "$-1$". As is obvious from the next step, the generated digit in the step 1 will occur in the next conversion. That is, since the input voltage $V_i$ is 0 (V), the generated digit is given by "0".

Consequently, the analog input voltage $\tfrac{3}{8}$ (V) is converted to the digits 1, 0, $-1$, 0. These digits are divided into two binary numbers by "code conversion" as explained below.

Referring to FIG. 6, the generated digits are shown by (1, 0, $-1$, 0). In the shift register SR1, code converted binary numbers (1, 0, 0, 0) are stored, and in the shift register SR2, code converted binary numbers (1, 1, 0, 1) are stored. In this case, a 2's complement binary code of the numbers (0, 0, 1, 0) is used at the shift register SR2. This is because both binary numbers stored in the SR1 and SR2 can be added only in the adder CT as explained below.

In the shift registers SR1 and SR2, the least significant bit (LSB) is on the right side, and the most significant bit (MSB) is on the left side. These values are added by the adder CT. The operation of the adder is explained is FIGS. 7 and 8. As is obvious from the figure, although the digits stored in the SR1 and SR2 are given by four digits, five digits have occurred due to the carry of the MSB in the shift registers SR1 and SR2. Accordingly, the fifth bit (=1) of the MSB is inverted to "0" by using the inverter INV. Consequently, the binary number (0 1 1 0) is obtained from the output of the adder CT. This binary number is, of course, equal to the analog number $\tfrac{3}{8}$.

Figure 7:
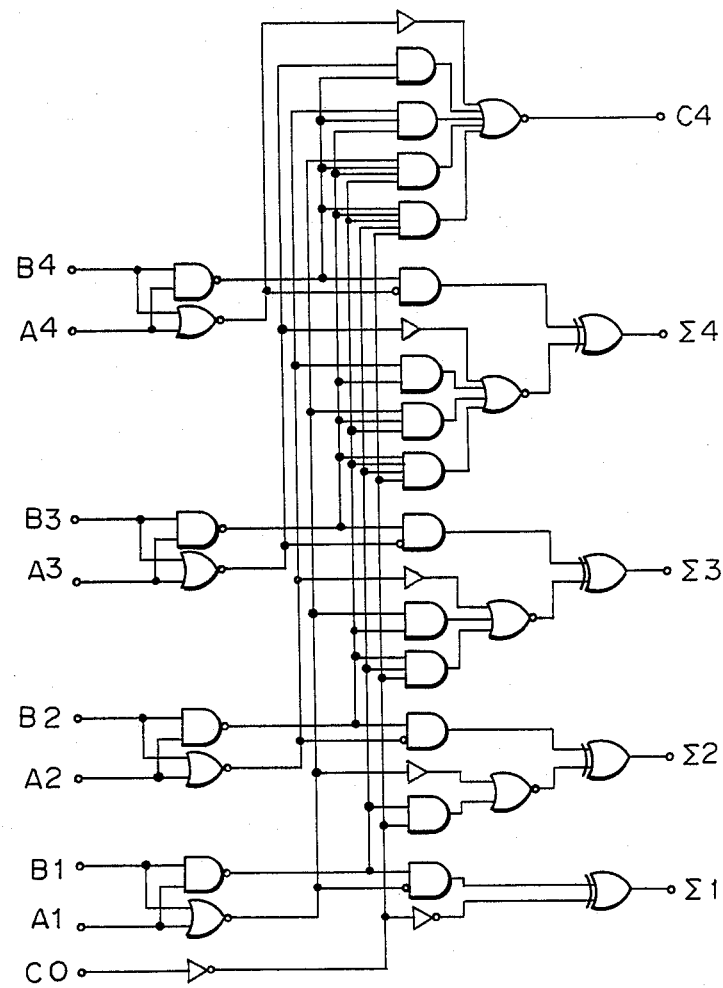
FIG. 7 is a partial circuit diagram of a conventional adder.

Referring to FIGS. 7 and 8, this circuit and function chart are well-known, as is the adder. This adder is the 4 bits binary full adder MODEL MB74LS283 made by Fujitsu Limited. For example, when inputs A1, A2 are "H" level and inputs B1, B2 are "L" level, outputs $\Sigma 1$, $\Sigma 2$ are "L" level when an input C0 is "H" level, and when inputs A3, B3 are "L" level and inputs A4 and B4 are "H", level, outputs $\Sigma 3$, $\Sigma 4$ are "H" and "L" level respectively, when an input C0 is "H" level.

The above explained embodiment shown in FIGS. 3A to 3H is performed when the charging/discharging unit comprises only one capacitor and corresponding switch, i.e., the capacitor C1 and the switch S3.

Next, an explanation will be given of why a plurality of charging/discharging units and corresponding comparators are provided in the analog-to-digital conversion circuit. In this case, it is assumed that all capacitors have equivalent capacitances. By this structure, the analog-to-digital conversion speed can be considerably increased. As explained before, two charging/discharging units are initially used, as shown in FIG. 4, and accordingly, in this case the number of capacitors is two. The following explanation applies when the number of capacitors is (n−1) (n is an integer which is larger than three).

In the control circuit 12, there are provided (n−1) pieces of comparators, flip-flop circuits and gate circuits. In this case, the switch connected to the number "i" capacitor is controlled by the control signals from the gate circuit. The control signals are equivalent to the signals S3A, S4A, S5A, S3B, S4B, and S5B.

The decision level voltage for the number "i" comparator is given by $V_R \cdot i / n$ (V). This decision level voltage $V_R \cdot i / n$ is compared with the $V_{CMP}$, and thus it is possible to obtain resultant data of m bits (n=$2^m$) as the analog-to-digital conversion.

When the input voltage $V_i$ ($V_R \cdot i/n \leq V_i < V_R \cdot (i+1)/n$) is input to the other analog processing unit, the outputs of the comparators from number one to number i are "H" level, and outputs of the remaining comparators are "L" level. At this time, the capacitor C2 and all capacitors in the charging/discharging unit are connected to the input side. In next step, the output of the comparator is applied to the analog processing unit which is changed to the output state after conversion.

As a result, the switches from number one to number i in the unit are connected to the reference voltage $V_R$ side, and remaining switches are connected to the ground side. By these connections, the output voltage $V_0$ is given as follows.

$$V_0 = n \cdot V_i - i \cdot V_R$$

In this case, the voltage range is given by $$0 \leq V_0 \leq V_R$$

This output range is preferable since the output voltage lies in the above range.

Resultant data analog-to-digital conversion can be obtained by a priority encoder (for example, Model SN74LS148 made by TEXAS INSTRUMENTS CO.). In this case, the input terminal (signal "0" input terminal) of the priority encoder is activated, and the first output of the comparator is added to the signal "1" input to the terminal of the priority encoder. Below, the number "(n−1)" output of the comparator is sequentially connected to the signal "n−1" input terminal of the priority encoder. In this case, it is necessary to provide an invertor circuit between the comparator and the priority encoder in accordance with a positive logic or negative logic operation.

When the number n is given by $2^m$ (m is an integer which is larger than two), m bits resultant data of analog-to-digital conversion data from the MSB are obtained in the first conversion cycle, below, in every conversion cycle, m bits data from the MSB are output as the output of the priority encoder. As explained above, high speed analog-to-digital conversion can be achieved by this method.

Figure 9:
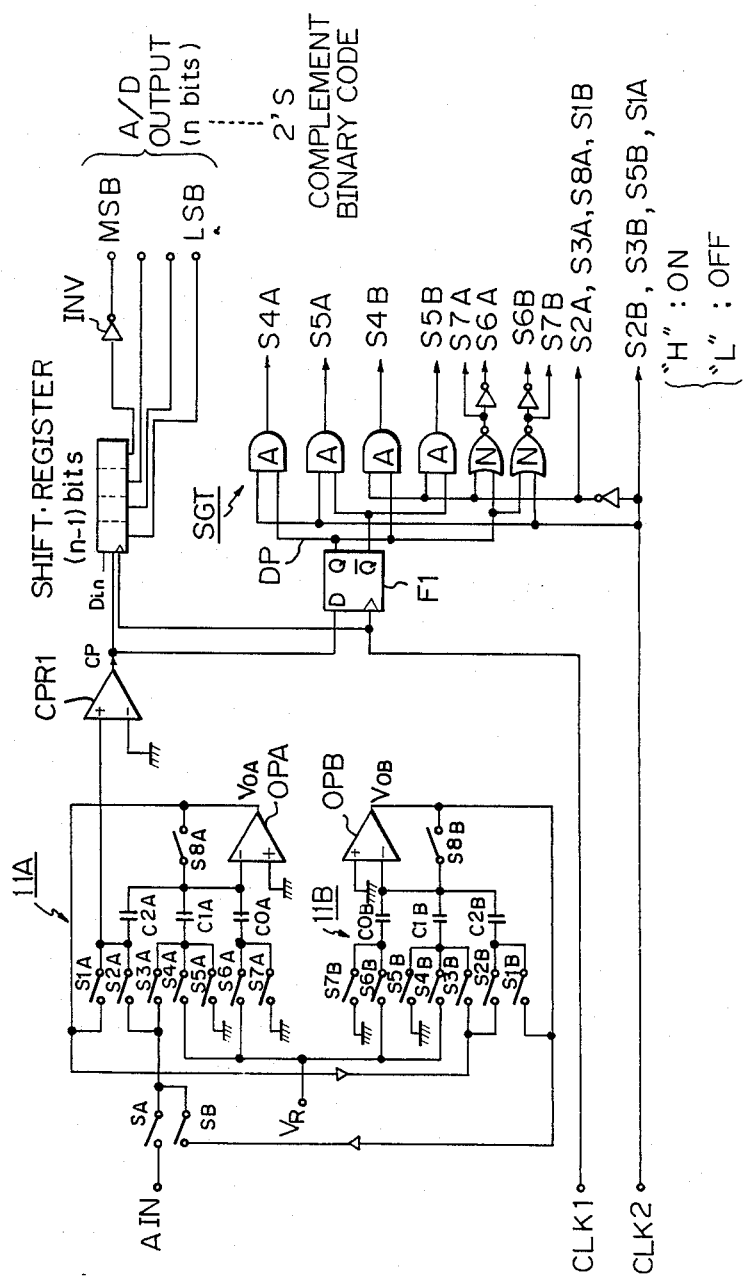
FIG. 9 is a detailed block diagram of an analog-to-digital conversion circuit according to another embodiment of the present invention.

Referring to FIG. 9, the differences from the first embodiment shown in FIG. 4 lie in that the comparator CPR2, the flip-flop F2, the shift register SR2, and the adder CT are eliminated. By these modifications, the inputs of the NOR gates for the control signal S6A, S7A, S6B, S7B are connected to the flip-flop F1 instead of F2. The output of the shift register SR1 is directly sent to the output terminal except for the MSB. The MSB of the shift register SR1 is output through the inverter INV. In this comparator CPR1, one input terminal is connected to the analog processing unit and the other input terminal is connected to the ground.

Figure 10:
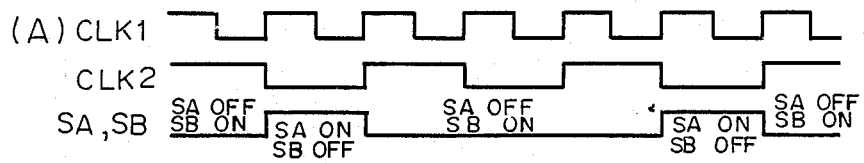
FIG. 10 is a chart for explaining the operation of the circuit shown in FIG. 9.

Referring to FIG. 10, the outputs CN and DN shown in FIG. 5 are eliminated. Regarding the operations from steps 1 to 4, since the same explanations as shown in FIG. 5 apply, detailed explanations thereof will be omitted.

After these steps, the generated digits "1 −1 1 1" are obtained. These digits are converted to the binary number by plus/minus code conversion so that binary codes "1 0 1 1" and "0 1 0 0" are obtained.

The reason for the elimination of the adder CT is as follows. That is, when the generated digits are given by "1, (−1), 1, 1", the code conversion for plus and minus becomes "1, 0, 1, 1" and "0, 1, 0, 0". However, for the code conversion for minus, the 2's complement number "1, 0, 1, 1" is used, and this binary code and the above "1, 0, 1, 1" at the code conversion for plus are added. Therefore, the above calculation can be easily performed by only shifting a digit in the shift register SR1. Consequently, it is not necessary to provide the adder in the analog-to-digital conversion circuit. However, the inverter is necessary to the MSB.

Figure 11:
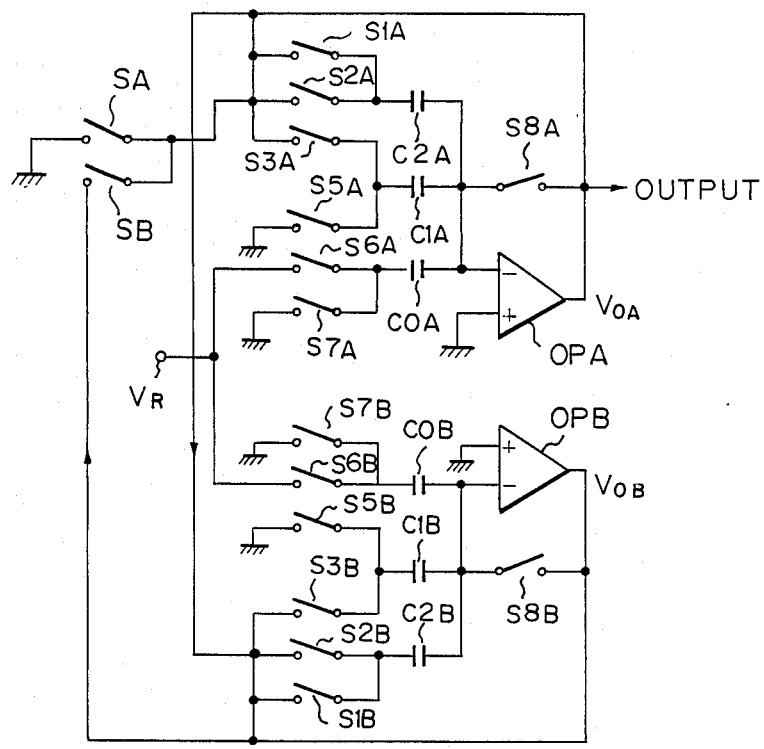
FIG. 11 is a detailed block diagram of a digital-to-analog conversion circuit according to an embodiment of the present invention.

Referring to FIG. 11, the switches S8A and S8B correspond to the switch S1 of FIGS. 3E to 3H; S1A, S2A, and S1B, S2B correspond to the switch S2; S3A, S5A, and S3B, S5B correspond to the switch S3; and S6A, S7A, and S6B, S7B correspond to the switch S4.

For a digital-to-analog conversion, the operations of the switches S1A, S2A, S3A, S5A, S8A, S1B, S2B, S3B, S5B and S8B are made regardless of the input digital code, but the operations of the switches S6A, S7A, S6B and S7B depend on the input digital code. An example of a digital-to-analog conversion will be explained with reference to FIGS. 12, 13A, and 13B.

Figure 12:
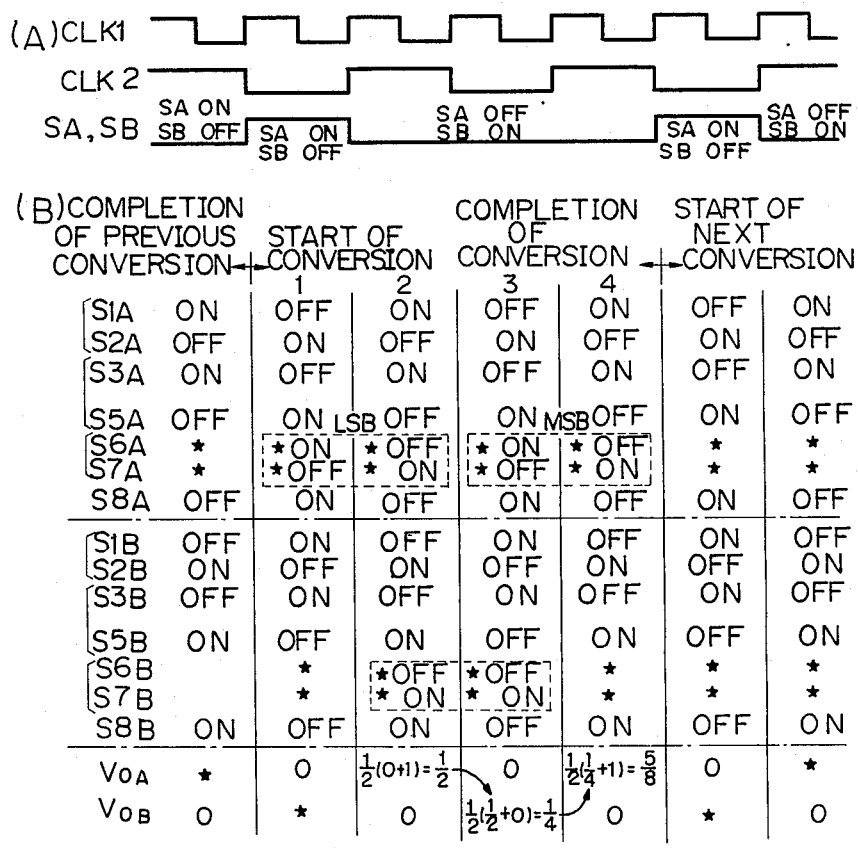
FIG. 12 is a chart for explaining the operation of the circuit shown in FIG. 11, FIGS. 13A and 13B are views for explaining switch operations in response to the clock signal CLK2 shown in FIG. 12.
Figure 13A:
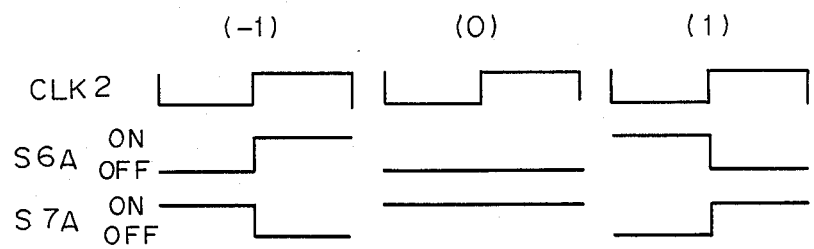
Figure 13B:
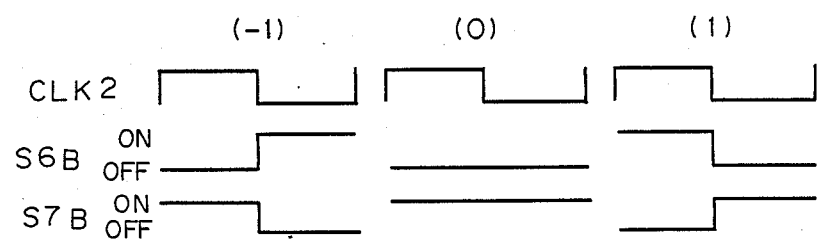

Referring to FIG. 12, this chart shows a case wherein the digital value (0.101) is converted to the analog value ($\frac{5}{8}$). As shown in FIG. 13A, since the least significant bit LSB is "1", the ON/OFF of the switches S6A and S7A becomes as shown by steps 1 and 2. Similarly, since the most significant bit MSB is "1", the ON/OFF of the switches S6A and S7A also becomes as shown by steps 3 and 4. These switch configurations are the same between steps 1, 2 and steps 3, 4. However, regarding the intermediate bit "0", as shown in FIG. 13B, the ON/OFF of the switches S6B and S7B becomes as shown by steps 2 and 3.

In step 2, the output V0A of the operational amplifier OPA is given based on the formula $V_0 = (V_i + V_R)/2$ as follows.

$$V_{0A} = \tfrac{1}{2}(0+1) = \tfrac{1}{2}$$

where, $V_i = 0$, $V_R = 1$.

In step 3, the output $V_{0B}$ of the operational amplifier OPB is given as follows.

$$V_{0B} = \tfrac{1}{2}(\tfrac{1}{2}+0) = \tfrac{1}{4}$$

where, $V_i = V_{0A} = \tfrac{1}{2}$, $V_R = 0$.

In step 4, the output $V_{0A}$ of the operational amplifier OPA is given as follows.

$$V_{0A} = \tfrac{1}{2}(\tfrac{1}{4}+1) = \tfrac{5}{8}$$

where, $V_i = V_{0B} = \tfrac{1}{4}$, $V_R = 1$.

Consequently, the analog output voltage $\tfrac{5}{8}$ (V) can be obtained from the output of the operational amplifier OPA.

Figure 14:
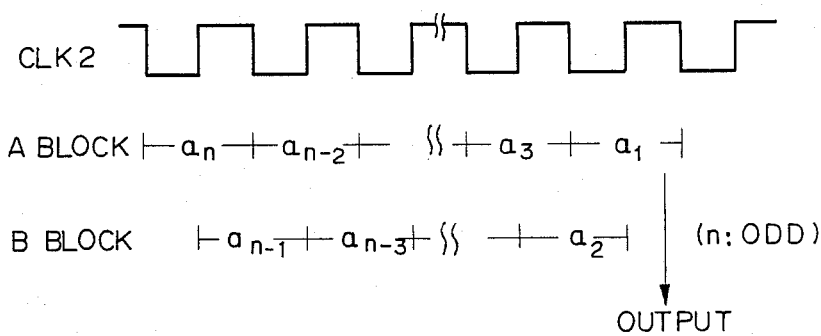
FIG. 14 is a view for explaining the digital-to-analog conversion shown in FIG. 11, and FIGS. 15A and 15B are charts for explaining a conversion range and codes of the A/D and D/A conversion in the best mode.

Referring to FIG. 14, the digital input code is given by "0·.a₁a₂ --- $a_{n-1}$ $a_n$". The conversion of the input code to the analog value is started from the LSB, and the conversion regarding the absolute section $a_1$ to $a_n$ is completed by (n+1) cycles of the clock signal CLK2. When the number n is odd, the converted analog output is obtained by the $V_{0A}$, and when the number n is even, the converted analog output is obtained by the $V_{0B}$.

Referring to FIGS. 15A and 15B, these charts represent a conversion range and codes of the A/D and D/A changeable converter constituted by an integrated circuit (IC). Since the resolution rate is 16 bits, 1LSB becomes $V_R/2^{15}$. In FIG. 15A, when the analog input voltage $V_i$ is zero volt, the output digital code is given by "0000 --- 0000". When the analog input voltage $V_i$ is $V_R/2$ ($V_R$ is the reference voltage as explained above), the output digital code is given by "0100 --- 0000". When the input voltage $V_i$ is $(+V_R - 1\text{LSB})$ or is larger than $+V_R$, the output code is given by "0111 --- 1111". In FIG. 15B, contrary to FIG. 15A, when the input digital code is "0000 --- 0000", the analog output voltage $V_0$ is given by zero volt, and when the input digital code is "0111 --- 1111", the analog output voltage is given by $(V_R - 1\text{LSB})$.

We claim:

1. An analog processing unit connected to an input terminal for receiving an input voltage, to a reference voltage terminal for receiving a reference voltage and to a ground terminal, said analog processing unit performing a selected voltage conversion of the input voltage and comprising:
   an operational amplifier having a non-inverting input terminal connected to the ground terminal, an inverting input terminal, and an output terminal;
   first switching means for connecting and disconnecting the inverting input and output terminals of said operational amplifier;
   a first capacitor having one end connected to the inverting input terminal of said operational amplifier;
   second switching means for connecting the other end of said first capacitor to one of the input terminal and the output terminal of said operational amplifier;
   a second capacitor having one end connected to the inverting input terminal of said operational amplifier; and
   third switching means for connecting the other end of said second capacitor to one of the input terminal, the ground terminal and the reference voltage terminal.

2. An analog processing unit as claimed in claim 1, wherein said first and second capacitors have equivalent capacitances.

3. An analog processing unit as claimed in claim 1, further comprising:
   a third capacitor having one end connected to the inverting input terminal of said operational amplifier; and
   fourth switching means for connecting the other end of said third capacitor to one of the reference voltage terminal and the ground terminal.

4. An analog processing unit as claimed in claim 3, wherein said first, second and third capacitors have equivalent capacitances.

5. An electronic conversion circuit for converting an input analog value to digital codes, comprising:
   at least two analog processing means for sampling an analog value to convert the analog value to an output analog value, each comprising:
      an operational amplifier having a non-inverting input terminal connected to the ground terminal, an inverting input terminal, and an output terminal;
      first switching means for connecting and disconnecting the inverting input terminal and the output terminal of said operational amplifier;
      a first capacitor having one end connected to the inverting input terminal of said operational amplifier;
      second switching means for connecting the other end of said first capacitor to one of the input terminal and the output terminal of said operational amplifier;
      a second capacitor having one end connected to the inverting input terminal of said operational amplifier; and
      third switching means for connecting the other end of said second capacitor to one of the input terminal, the ground terminal and the reference voltage terminal; and
   control means for controlling said analog processing means and for outputting a digital value based on the output analog value, of one of said analog processing means.

6. An electronic conversion circuit as claimed in claim 5, further comprising control means for controlling said electronic conversion circuit, comprising:
   at least one comparator for comparing the output analog value from each of said analog processing means with at least one decision level and outputting a digital value as a result of said comparison;
   at least one shift register for converting a series digital value to a parallel digital value in order to obtain digital codes; and
   a gate circuit for controlling operations in each of said analog processing units.

7. An electronic conversion circuit as claimed in claim 6, wherein said control means further comprises as adder circuit, operatively connected to said at least one shift register, for adding the parallel digital value in order to obtain the digital codes.

8. An electronic conversion circuit as claimed in claim 6, wherein said at least one comparator includes a plurality of comparators, each having a different decision level.

9. An electronic conversion circuit for converting digital codes to an output analog value comprising:
   at least two analog processing means for performing sampling of an analog value, receiving digital codes and converting the digital codes in order to obtain an analog value, each comprising:
      an operational amplifier having a non-inverting input terminal connected to the ground terminal, an inverting input terminal, and an output terminal;
      first switching means for connecting and disconnecting the inverting input terminal and the output terminal of said operational amplifier;
      a first capacitor having one end connected to the inverting input terminal of said operational amplifier;
      second switching means for connecting the other end of said first capacitor to one of the input terminal and the output terminal of said operational amplifier;
      a second capacitor having one end connected to the inverting input terminal of said operational amplifier; and
      third switching means for connecting the other end of said second capacitor to one of the output terminal of said operational amplifier, the ground terminal and the reference voltage terminal.

* * * * *

UNITED STATES PATENT AND TRADEMARK OFFICE
CERTIFICATE OF CORRECTION

PATENT NO. : 4,760,376

DATED : July 26, 1988

INVENTOR(S) : Kobayashi et al.

It is certified that error appears in the above-identified patent and that said Letters Patent is hereby corrected as shown below:

Col. 1, line 40, "to" should be --is to--;
line 45, "value" should be --value,--;
line 60, after "of" insert --the--;
line 61, "4" should be --4,--;
line 62, "6" should be --6 is--.

Col. 2, line 30, "V" should be --$V_i$--;
line 32, "$V_r/2$" should be --$V_R/2$--;
line 33, "$V_{Ad}$" should be --$V_{AD}$--;
line 59, delete "of the reference voltage $V_R$";
line 59, "subtraction without" should be --subtraction or without--;
line 60, "traction in" should be --traction of the reference voltage $V_R$ in--.

UNITED STATES PATENT AND TRADEMARK OFFICE
CERTIFICATE OF CORRECTION

PATENT NO. : 4,760,376
DATED : July 26, 1988
INVENTOR(S) : Kobayashi et al.

It is certified that error appears in the above-identified patent and that said Letters Patent is hereby corrected as shown below:

Col. 4, line 48, "noninvert-" should be --non-invert- --.
Col. 5, line 1, delete "in".
Col. 7, line 21, "switches COA" should be --switches. COA--;
line 27, "and S7B" should be --and S6B, S7B--.
Col. 10, line 50, "invertor" should be --inverter--.
Col. 11, line 50, "VOA" should be --$V_{OA}$--.

Signed and Sealed this

Fourteenth Day of February, 1989

Attest:

DONALD J. QUIGG

*Attesting Officer*    *Commissioner of Patents and Trademarks*